United States Patent [19]

Kroger

[11] 4,224,630
[45] Sep. 23, 1980

[54] MULTIPLE WEAK-LINK SQUID

[75] Inventor: Harry Kroger, Sudbury, Mass.

[73] Assignee: Sperry Corporation, New York, N.Y.

[21] Appl. No.: 937,014

[22] Filed: Aug. 25, 1978

Related U.S. Application Data

[63] Continuation of Ser. No. 836,452, Sep. 26, 1977, abandoned.

[51] Int. Cl.² ............................................. H01L 39/22
[52] U.S. Cl. ........................................ 357/5; 307/306;
29/599; 324/248
[58] Field of Search .............. 357/5; 307/306; 29/599;
324/248

[56] References Cited

U.S. PATENT DOCUMENTS

| | | | |
|---|---|---|---|
| 3,549,991 | 12/1970 | Liher | 324/43 |
| 4,025,844 | 5/1977 | Deutscher | 324/43 R |
| 4,055,847 | 10/1977 | Fletcher | 357/5 |

OTHER PUBLICATIONS

Lum et al., *Journal of Appl. Phys.*, vol. 46, No. 7, Jul. 1975.

*Primary Examiner*—Martin H. Edlow
*Attorney, Agent, or Firm*—Howard P. Terry; Albert B. Cooper

[57] ABSTRACT

The disclosed SQUID (superconducting Quantum Interference Device) comprises two superposed superconductive layers with an insulating layer therebetween. A plurality of holes through the insulating layer filled with superconductive material form weak-links between the superconductive layers. One or more control lines superposed with respect to the superconductive layers provide magnetic flux through the area between the weak-links to control the zero voltage supercurrent flowing through the weak-links from one of the superconductive layers to the other thereby providing the switching function for Josephson superconductive circuits.

11 Claims, 10 Drawing Figures

MULTIPLE WEAK-LINK SQUID

This is a continuation of application Ser. No. 836,452, filed Sept. 26, 1977, now abandoned.

BACKGROUND OF THE INVENTION

1. Field of the Invention

The invention relates to superconductive circuits and comprises a novel SQUID (Superconducting Quantum Interference Device) configuration. The invention is particularly applicable to utilization in Josephson circuits.

2. Description of the Prior Art

Superconductive Josephson logic and memory circuits are known in the art wherein the active switching elements or gate is the conventional Josephson tunnel junction. The Josephson junction comprises two superposed layers of superconductive material with an insulator layer therebetween sufficiently thin to support the Josephson tunneling effect. As is known, Josephson tunnel junctions suffer from numerous disadvantages. While the superconductive metals such as lead, indium and tin or alloys thereof exhibit suitable superconductive properties, these materials cause difficulties when fabricating superconductive integrated circuits utilizing fine line interconnections. When utilizing standard lithographic processes to produce such circuits, the metal layers tend to move and form hillocks during heating at temperatures greater than 70° C., which temperatures are normally required in performing the printed circuit fabrication operations. Printed circuit fabrication techniques that tend to partially ameliorate the difficulties tend to be more complicated than more conventional fabrication techniques that presently produce high yield integrated circuits of a more conventional variety such as semiconductor circuits. In place of the relatively low melting point superconductive metals mentioned, aluminum has been utilized as the superconductor to alleviate the problem but aluminum has a significantly lower superconductive transition temperature than, for example, lead and therefore requires more energy to refrigerate the devices.

The conventional Josephson tunnel junction requires an insulating layer sufficiently thin (5-30 angstrom units) to support Josephson tunneling. Utilizing present day integrated circuit fabrication techniques, it is exceedingly difficult to produce such thin layers with uniform thickness. As is known, the zero voltage Josephson current through the tunnel junction depends strongly upon the thickness of the tunneling insulator barrier, the dependence being at least as strong as exponential. Thus, small variations in barrier thickness produces large variations in the zero-voltage Josephson current. This results in the undesirable effect of Josephson junctions having wide variations in properties which adversely affects the yield of integrated circuits utilizing such elements.

An additional disadvantage of the Josephson tunnel junction is that spurious unwanted resonance states can occur that tend to disrupt the desired operation of the junction. In order to alleviate this problem prior art techniques utilize critical control of dimensional parameters and shapes of the junctions necessitating undesirably complex fabrication techniques.

Additionally methods of fabricating niobium-niobium pentoxide-niobium tunnel junctions have been devised although such junctions have not to date been utilized in memory or logic circuits. It is recognized that although such junctions utilize refractory superconductive materials, thus not suffering from the disadvantages discussed above with respect to the low melting point materials, an extremely difficult fabrication procedure is required. Furthermore, such junctions suffer from the above described disadvantages with respect to Josephson tunnel junctions.

It is believed that heretofore only Josephson tunnel junctions have been utilized or considered as the active switching element for superconductive logic and memory circuits. Although the Josephson tunnel junction has had adequate sensitivity in control of the critical current by means of overlying control lines, it is desirable to further enhance the control sensitivity of the switching element so as to further improve the parameters of the circuits in which the switches are utilized.

Additionally the "weak-link" Josephson device or microbridge is known in the prior art primarily in the context of utilization in SQUID magnetometers. Such weak-links or microbridges are generally difficult to fabricate requiring expensive time consuming detailed contouring by electron beam etching. Such devices are generally planar SQUIDs with the weak-links parallel to the device ground plane, which configuration would render the magnetic field of an overlying control line ineffective in regulating the critical currents. Although the SQUID arrangement of plural microbridges provides great sensitivity of critical current with respect to the magnetic fields in which the magnetometer may be immersed, a single weak-link is substantially insensitive to control by magnetic fields since it is the magnetic flux linking the area of the weak-link that provides the control and the area of the weak-link necessarily is exceedingly small. Thus such planar SQUIDs and single weak-links have not heretofore been considered useful as the active switching element in Josephson circuits which in practical arrangements require magnetic field control via overlying control lines.

SQUID devices are also known in the art that utilize Josephson tunnel junctions as the active switching elements. Such devices form the macro memory and logic elements which themselves require the utilization of the Josephson tunnel junction as the active switching elements thereof.

The SQUID of the present invention may be advantageously utilized, inter alia, as the replacement for the Josephson tunnel junction as the active switching element for utilization in logic and memory circuits.

SUMMARY OF THE INVENTION

The invention comprises a SQUID having first and second superconductive layers superposed with respect to each other with an insulator layer disposed therebetween. A plurality of small dimensioned holes through the insulator filled with the superconductive material form a plurality of weak-links between the first and second layers.

Preferably the SQUID is constructed on, and electrically insulated from, a superconductive ground plane. In its preferred embodiment one or more control lines in a plane parallel to, and electrically insulated from the upper superconductive layer of the SQUID provides the magnetic fields for controlling the critical current through the weak-links.

Although the preferred embodiment of the invention will be described in terms of utilization as the active switching element in Josephson superconductive circuits, it will be appreciated that the invention may also be utilized, for example, as a magnetometer.

BRIEF DESCRIPTION OF THE DRAWINGS

FIG. 7, comprising

DESCRIPTION OF THE PREFERRED EMBODIMENT

The multiple weak-link SQUID of the present invention is preferably embodied as the active switching element for superconductive logic and memory circuits but can be utilized in other applications such as magnetometers.

Figure 1:
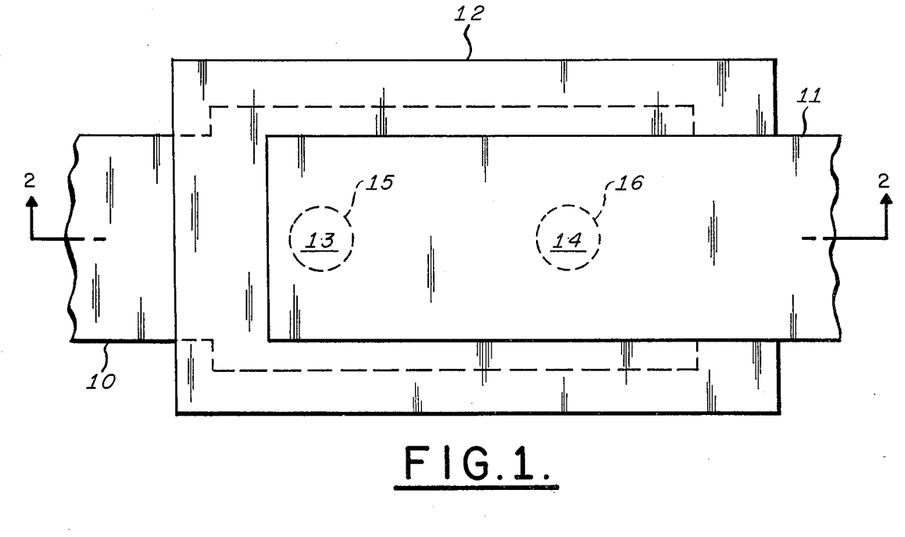
FIG. 1 is a top view partly in phantom of the SQUID of the present invention.
Figure 2:
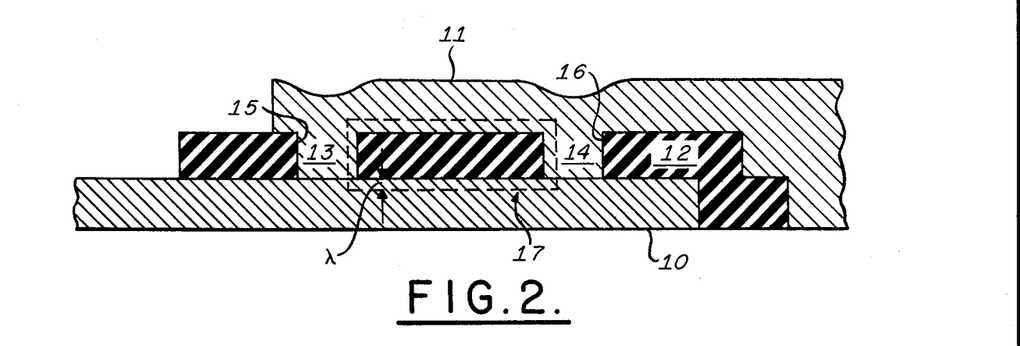
FIG. 2 is a cross-section of the SQUID of FIG. 1 taken along line 2—2.

Referring to FIGS. 1 and 2, a top view and a cross-sectional elevation view of the SQUID of the present invention are illustrated respectively. The SQUID comprises a lower layer 10 of superconductive material and a superposed upper layer 11 thereof. The layers 10 and 11 can be comprised of any superconductive material and preferably a refractory metal such as niobium is utilized. Disposed between the layers 10 and 11 is an insulator layer 12. A practical embodiment of the device utilized an insulator layer of silicon dioxide deposited over the lower superconductor 10 to a thickness of approximately 3,000 angstrom units. It will be appreciated that other conveniently deposited insulator materials of other thicknesses can also be utilized. For example, sputtered silicon or germanium could be used as the cryogenic insulators if the insulating layer is sufficiently thick to prevent conduction. Silicon layers of between 1,000 and 3,000 angstrom units thickness have been utilized as cryogenic insulators. Chemically vapor deposited layers of glass could also be used as well as evaporated layers of silicon monoxide. Preferably the insulator layer 12 should be so constituted as not to support significant Josephson tunneling.

In accordance with the invention, two weak-links 13 and 14 are included coupling the superconductive layer 10 to the superconductive layer 11. The weak-links 13 and 14 are formed by small diameter holes 15 and 16 through the insulator layer 12 filled with superconductive material when the superconductive layer 11 is deposited over the insulator layer 12. The holes 15 and 16 may conveniently have a diameter of one micron. It will be appreciated that more than two weak-links may be provided through the insulator 12 for reasons to be later discussed. It will furthermore be appreciated that the dimension of one micron is exemplary, other dimensions being useable that support the weak-link properties.

An area 17 is illustrated which is generally bounded by the weak-links 13 and 14 and the surfaces of the upper and lower superconductive layers 10 and 11 adjacent the insulator 12. The total effective area is defined in accordance with the depth of penetration of magnetic fields into the superconductive material which depth of penetration is given by the London penetration depth $\lambda$. The control of the critical current through the SQUID from the layer 10 to the layer 11 is provided by the magnetic flux that threads the area 17 in a manner to be described.

Figure 3:
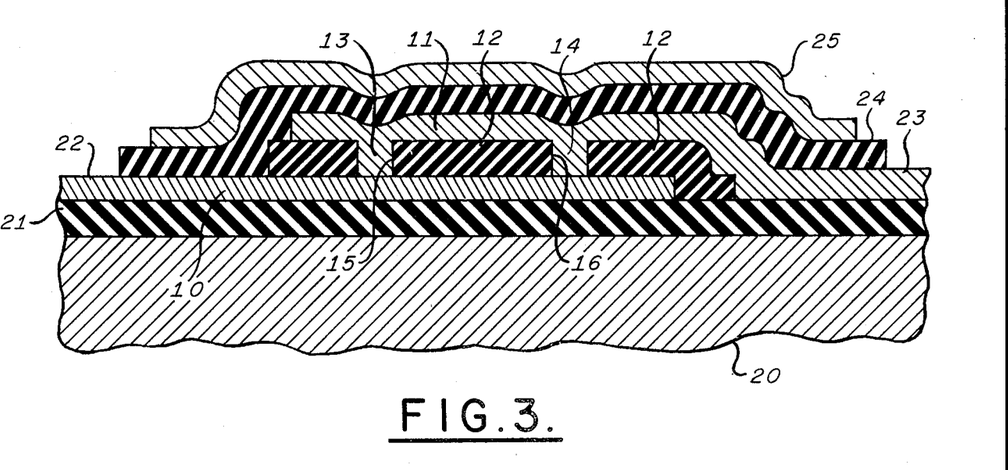
FIG. 3 is a more detailed cross-sectional view of the SQUID of the present invention.

Referring to FIG. 3 in which like reference numerals indicate like components with respect to FIGS. 1 and 2, a more detailed cross-section of the SQUID of the present invention is illustrated. As is known by those skilled in the art, superconductive Josephson logic and memory circuits are generally planar devices with the elements thereof deposited on a superconductive microwave ground plane with the superconductive lines of the device forming microwave strip transmission lines with respect thereto. Accordingly, the lower superconductive layer 10 is deposited over a superconductive ground plane 20 separated by a microwave strip transmission line dielectric layer 21. Conveniently the ground plane 20 may be a sputtered layer of niobium 1,000 to 5,000 angstrom units thick deposited on an oxided silicon substrate (not shown) with the dielectric layer 21 comprised of sputtered silicon dioxide or amorphous silicon deposited on the ground plane 20. Superconductive microwave strip extensions 22 and 23 of the superconductive layers 10 and 11, respectively, are deposited on the dielectric layer 21 and form part of the superconductive Josephson logic or memory circuit in which the SQUID is utilized as an active switch.

A further insulator layer 24 deposited over the superconductive layer 11 functions to electrically insulate a control line 25 from the layer 11. The control line 25 is a superconductive strip disposed parallel to the strips 11 and 10 at least in the area of the weak-links 13 and 14. In a practical circuit the control line 25 should not run superposed with respect to the extensions 22 and 23 so as not to disrupt the microwave transmission line properties thereof. In a manner to be described in detail, current through the control line 25 generates a magnetic field resulting in control flux threading the area 17 (FIG. 2) thus providing control of the current through the weak-links 13 and 14. The superconductive ground plane 20 functions to confine all of the magnetic fields produced by currents flowing in the microwave strips to the same side of the ground plane 20 as the sources of the fields. Thus the ground plane 20 increases the coupling of the magnetic field generated by the control line 25 to the SQUID. The planes containing the upper and lower superconductive layers 11 and 10 are substantially parallel to the planes of the superconductive ground plane 20 and the control line 25 with the weak-links 13 and 14 disposed substantially orthogonally with respect thereto.

Figure 4:
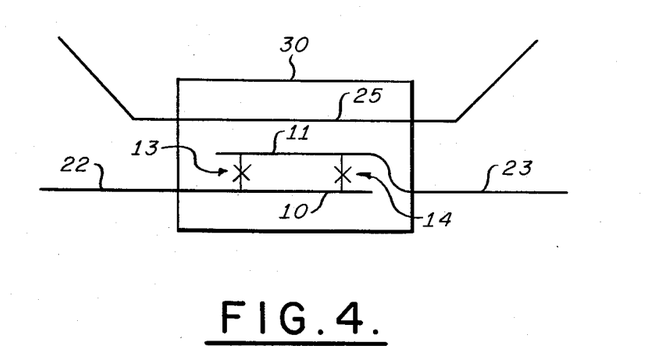
FIG. 4 is a symbolic schematic representation of the SQUID of the present invention.

Referring to FIG. 4, a schematic representation of the SQUID depicted in FIGS. 1, 2 and 3 is illustrated where like reference numerals indicate like components with respect to FIGS. 1, 2 and 3. The active SQUID switching elements utilized in Josephson logic and memory circuits may be designated for convenience by the block 30.

Figure 5:
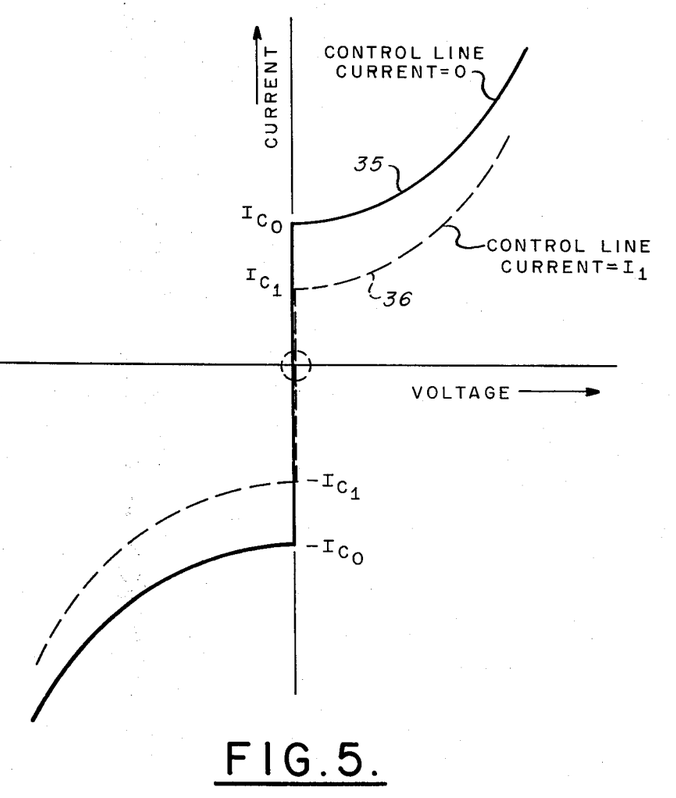
FIG. 5 is a graph of current-voltage characteristics of the SQUID of the present invention under conditions of different control currents.

In operation the current flowing between the lines 22 and 23 through the SQUID 30 is controlled by the magnetic field through the SQUID generated by current passed through the control line 25. FIG. 5 illustrates the current-voltage characteristics of the SQUID 30 when the control line current is equal to zero (curve 35) and when the control line current is equal to $I_1$ (curve 36). The current voltage characteristics of the SQUID 30 may be derived by forcing a variable current between the leads 22 and 23 and measuring the voltage therebetween for various values of d.c. current applied to the control line 25. These characteristics may conveniently be displayed on an oscilloscope by applying an a.c. current to the SQUID with a variable d.c. current applied to the control line 25. The critical current $I_c$ (the maximum d.c. zero voltage current) for zero control line current is $I_{c0}$ whereas the critical current for the control line current $I_1$ is $I_{c1}$. Thus when the external magnetic field applied to the SQUID is zero, the value of the current through the SQUID is the critical current $I_{c0}$. When a current $I_1$ is passed through the control line 25 the value of the current through the SQUID is the critical current $I_{c1}$.

Figure 6:
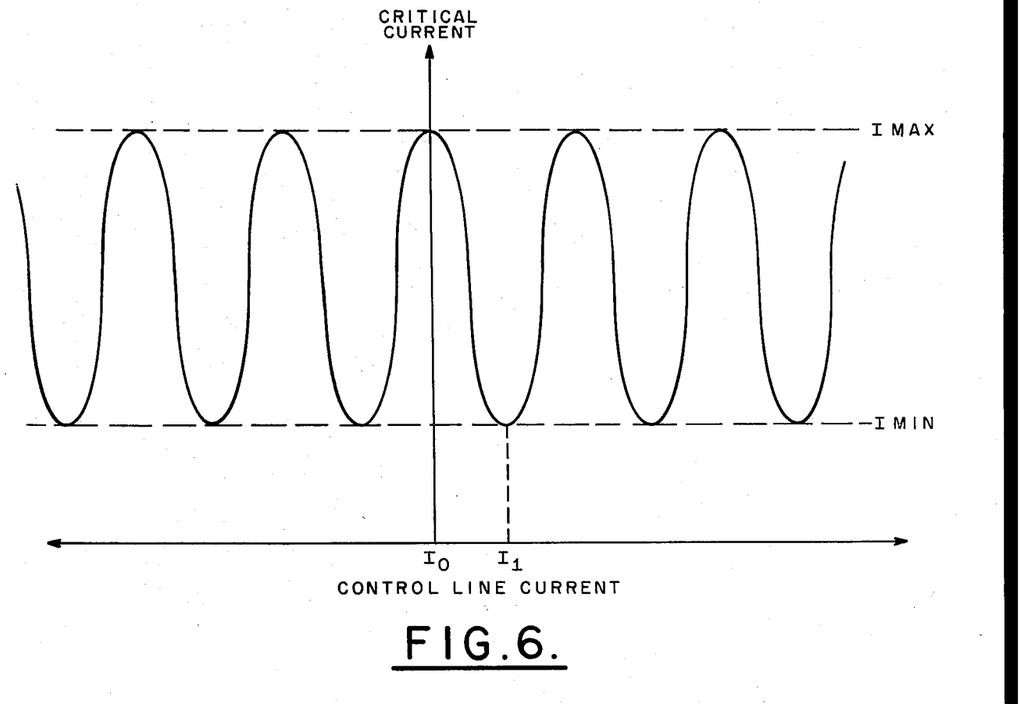
FIG. 6 is a graph of critical current versus control line current for the SQUID of the present invention manifesting the quantum interference effect thereof.

Referring to FIG. 6, the critical current $I_c$ of the SQUID as an implicit function of magnetic flux cutting through the area 17 or as a direct function of the control current flowing in the control line 25 is illustrated. As the control current is increased the magnetic flux linking the SQUID 30 is increased in direct proportion since there are no ferromagnetic materials present and as the control current is increased the critical current undergoes sinusoidal oscillations. A complete cycle of the sinusoid is generated when the magnetic flux linking the SQUID is increased by one flux quantum. When the control line current is zero a maximum critical current $I_{max}$ flows through the SQUID. When the control line current is increased to $I_1$, the critical current decreases to a minimum value of $I_{min}$.

It will be appreciated from FIGS. 5 and 6 that the SQUID 30 of the present invention may be utilized as a switch in Josephson logic and memory circuits under control of current applied through the control line 25. For example, when zero current is applied to the control line 25, the d.c. zero voltage current flowing through the SQUID is $I_{max}$. With a control line current of $I_1$ applied, the d.c. zero voltage current diminishes to $I_{min}$, thus providing the required control function for the Josephson circuits.

It will be appreciated that because of the novel configuration of the SQUID as illustrated in FIGS. 1-3, the device exhibits maximum sensitivity of the critical current through the SQUID to the control current through the line 25. The plane which contains the weak-links 13 and 14 is substantially perpendicular to the planes which contain the ground plane 20 as well as the upper and lower superconductive layers 10 and 11 and the control line 25. Thus the area 17 bounded by the weak-links 13 and 14 and the planes coinciding with the London penetration depth λ inside the upper and lower superconductors 10 and 11 will have a maximum projection against the direction of the magnetic field generated by the control current through the line 25. The magnetic flux linking the SQUID for a given control line current will therefore be maximum for this geometric arrangement and since the critical current depends upon magnetic flux rather than the magnetic field itself, the maximum sensitivity to the control current results. Additionally, the control sensitivity is maximum when the control current through the line 25 flows in the direction from 13 to 14 or visa versa rather than at an angle with respect to the plane of the drawing.

It is advantageous to maintain a high ratio of the maximum value of the critical current to the minimum value of critical current that can be supported by the SQUID ($I_{max}$ and $I_{min}$ of FIG. 3). This result is achieved by making the individual critical currents of the weak-links 13 and 14 as equal as possible which result is in turn accomplished by making the individual weak-links as alike as possible. Thus a desideratum of the SQUID fabrication procedure should be to obtain the same width and height of the weak-links with respect to each other. Methods of obtaining substantially identical weak-links are known in the art of depositing insulator films of uniform thickness and producing holes therein of uniform cross-section by electron beam lithography.

Because of the novel geometry of the SQUID of the present invention, regulation of the sensitivity to the magnetic field of the critical current through the SQUID is readily accomplished. This is achieved by varying the area 17 (FIG. 2). An increase in the height of the insulator layer 12 and a wider separation between the weak-links 13 and 14 will achieve an increase in the sensitivity to the magnetic field of the control line 25. A diminution in these dimensions results in a decreased sensitivity. Although the above described embodiment of the invention was explained in terms of the double weak-links 13 and 14, it will be appreciated that more than two weak-links may be utilized in practicing the invention for the advantages afforded thereby. For example, the weak-links in excess of two may, for example, be beneficially utilized to alter the dependence of critical current upon control line current.

Referring again to FIG. 3, the insulator layers 21 and 24 provide a different function from that of the insulator layer 12. The insulator layer 12 defines the weak-links 13 and 14 of the active device and, as previously explained, the thickness of the layer 12 affects the sensitivity of the device to control by the applied magnetic field. The thickness of the insulator layer 12 as well as its dielectric constant determine the lumped element equivalent capacitance of the device. The insulator layer 21 is the microwave strip transmission line dielectric which provides electrical isolation between the ground plane 20 of the microwave circuit and the strip transmission lines 22 and 23 which are extensions of the upper and lower superconductors 10 and 11 respectively of the active device. The dielectric layer 21 also insulates the extensions of the control line 25 from the ground plane 20. It is appreciated that the control line 25 cannot reside directly over the lines 22 and 23 except in the vicinity of the active SQUID device. The widths of the lines 22, 23 and 25, together with the thickness and dielectric constant of the insulator layer 21 determine the characteristic impedance or surge impedance of these microwave strip transmission lines.

Particular superconductive circuits in which the SQUID of the present invention may be utilized require specific ranges of acceptable characteristic impedances of the microwave strip transmission lines for proper operation of these circuits. For example, when utilized in memory loops of a type known in the art, critical damping is required to ensure stable current transfer events in a manner similar to the critical damping required of memory loops utilizing conventional Josephson tunnel junctions as the active devices. Critical damping, in turn, requires that the circuit extending to the active device appear inductive. Therefore, the characteristic impedance of the circuit must be small compared to an appropriate resistance level of the active device.

For reasons to be later discussed, the SQUID of the present invention imposes much less of a restriction on the impedance level of the microwave strip transmission lines than do Josephson tunneling junctions. Some restrictions, however, will be necessary even for these SQUID active devices. The choice of dielectric constant and thickness of the insulator layer 21, as well as the widths of the lines 22 and 23, and the width of the extensions of the line 25 not in the vicinity of the active device will be determined primarily by the general circuit considerations with respect to the circuit in which the devices are utilized and only partially determined by the SQUID of the present invention. In a similar manner the insulator layer 24 provides only electrical isolation of the control line 25 from the upper superconductive layer 11. The insulator layer 24 should have properties including thickness, uniformity of thickness and dielectric constant to minimize the impedance variations of the line 25 in the region where it crosses over the active device.

Because of the novel configuration of the SQUID of the present invention, as illustrated in FIGS. 1-3, fabrication thereof is facilitated compared to the fabrication steps required for prior art superconductive switches such as Josephson tunneling junctions. Preferably electron beam lithography or X-ray lithography is utilized to provide the submicron or micron dimensioned holes through the insulator layer 12. The holes for the weak-links 13 and 14 are the only electron beam generated pattern required and the fabrication thereof requires only a short time exposure of the electron resistive material utilized in the fabrication process to the electron beam in order to produce the pattern. Therefore, fabrication of the SQUID of the present invention does not require complex and lengthy and hence inefficient, expensive and time consuming electron beam exposure.

A method that may be utilized in fabricating a superconductive circuit utilizing the SQUID of the present invention as the active switches comprises the following steps:

(1) Depositing niobium ground plane 20 by sputtering (1,000-5,000 angstrom units thick) on oxided silicon substrate.

(2) Depositing silicon dioxide ($SiO_2$) or amorphous silicon (2,000-20,000 angstrom units thick) microwave strip transmission line dielectric layer 21 by sputtering.

(3) Using standard photoresistive procedures to pattern and etch the insulator layer 21 to expose the ground plane 20 for effecting electrical connections at required points to circuit patterns which will subsequently be deposited.

(4) Depositing 3,000 angstrom units of niobium.

(5) Using standard photoresistive procedures and chemical, dry chemical or sputter etching to pattern the layer of niobium deposited in step (4) to form the desired pattern of lower superconductive circuit islands. This layer of superconductive circuit islands includes superconductive layer 10 and its extension line 22.

(6) Depositing a layer of silicon dioxide ($SiO_2$) 3,000 angstrom units thick by sputtering. This layer includes the insulator layer 12.

(7) Removing unwanted silicon dioxide ($SiO_2$) by standard photoresistive and etching procedures. Region 10 of the lower superconductive layer deposited in step (4) remains completely covered.

(8) Using standard electron resistive techniques to pattern and etch a plurality of micron or submicron dimensioned holes in the silicon dioxide layer over each region 10 of each SQUID of the integrated circuit.

(9) Depositing a layer of niobium 3,000 angstrom units thick by sputtering. This forms the upper superconductive layers 11, their line extensions 23 and the weak-links 13 and 14 of the SQUID switches as well as the desired niobium leads of the circuit.

(10) Removing the unwanted portions of the niobium layer deposited in step 9 by standard photoresistive and etching procedures.

(11) Depositing the insulator layer 24 by sputtering 3,000 angstrom units of silicon dioxide ($SiO_2$) or evaporating silicon oxide (SiO).

(12) Removing unwanted areas of the insulator layer 24 by standard photoresistive and etching procedures. It is only required that the cross-over insulator layer 24 exist between niobium layers 25 and 11 or 23 and between layers 25 and 10 or 22.

(13) Sputtering the upper niobium layer forming the control lines 25. The layer deposited in this step can also function to form any required interconnections between layers 22 and 23 with respect to other portions of the circuit.

It will be appreciated that it is useful to perform a sputter etching step in the same vacuum system pump-down immediately preceding steps (9) and (13) to ensure that reproducible weak-links and good superconducting short-circuit interconnections are formed in these respective steps. It will furthermore be appreciated that the above described method is exemplary, other methods being useable to fabricate superconductive circuits utilizing SQUIDs as the active switches in accordance with the present invention.

Although the above described embodiment of the invention was illustrated with a single control line 25, it will be appreciated that a plurality of control lines may be utilized to control the switching of a SQUID thereby providing logic circuits whose outputs depend upon signals provided to two or more inputs. In the case where tunnel junctions are utilized as the active switching device, such logic arrangements are well known and can be utilized with the weak-link SQUIDs of the present invention to the same effect.

Figure 7A:
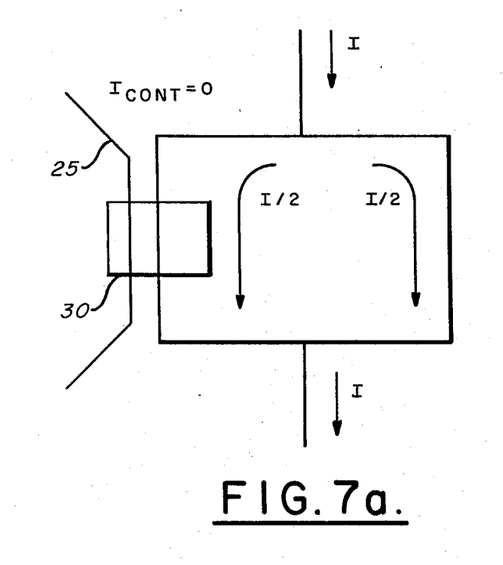
FIGS. 7a, 7b and 7c, are schematic diagrams of memory loops incorporating the SQUID of the present invention as the active switching element thereof.
Figure 7B:
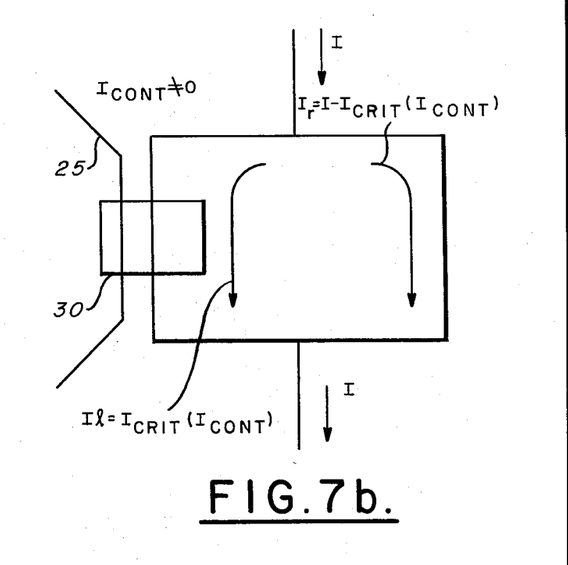

The weak-link SQUIDs of the present invention may be utilized in superconductive circuits such as Josephson memory and logic circuits as a replacement for the Josephson tunnel junction switch conventionally utilized in such applications. Referring to FIG. 7, a conventional superconductive memory loop is illustrated utilizing a SQUID as the active switching element in the left hand side of the loop. The SQUID is designated by the reference numeral 30 in accordance with the schematic representation discussed above with respect to FIG. 4. The weak-links of the SQUID 30 are perpendicular to the plane of the figure. Conventionally a Josephson tunnel junction would be utilized as the active switch. The operation of the loop for storing binary data is well understood in the art. As is known, with the configuration illustrated in FIG. 7a, current may be transferred from the left hand side of the loop to the right hand side. Assuming that the inductances of each side of the superconducting loop are equal, an initial application of a current I as illustrated in FIG. 7a to the parallel combination of the entire loop results in a current I/2 flowing in each side of the loop. It is assumed that the magnitude of I is sufficiently small so that I/2 does not exceed the critical current of the weak-link SQUID 30 contained within the left hand side of the loop. As illustrated in FIG. 7b, if a control line current $I_{cont}$ is applied to the control line 25, the critical current $I_{crit}$ of the SQUID 30 will be reduced to $I_{crit}(I_{cont})$. It is necessary that the magnitude of I and $I_{crit}$ be sufficiently large, and that the sensitivity of the critical current of weak-link SQUID 30 to the control line current be sufficiently large so that $I_{crit}(I_{cont}) < I/2$. It will be appreciated that the greater this inequality, the better will be the performance of the SQUID 30 with respect to lack of criticality of $I_{crit}$ and $I_{cont}$.

Figure 7C:
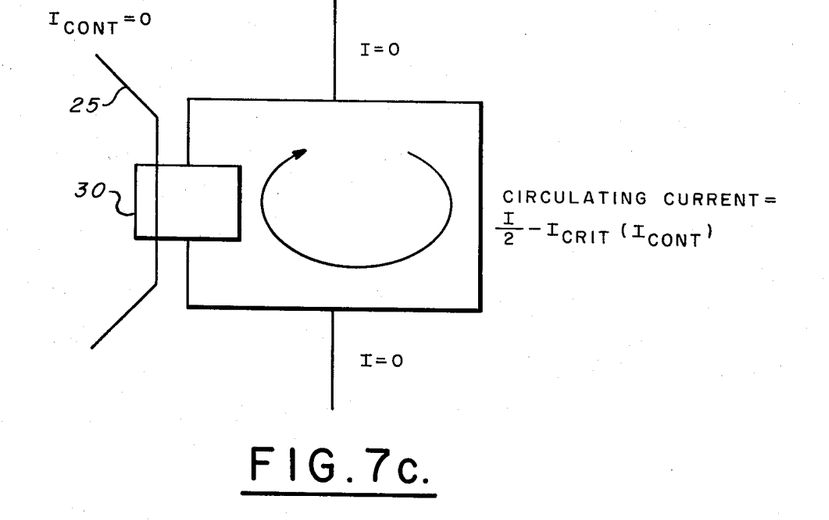

In accordance with the operation of the SQUID 30 as described above, after application of $I_{cont}$ to the control line 25, the current in the left hand side, $I_l$, of the loop will be $I_l = I_{crit}(I_{cont})$. The current then flowing in the right hand side of the loop, $I_r$, will be given by $I_r = I - I_{crit}(I_{cont})$. This current distribution after actuation of the switch 30 is illustrated in FIG. 7b. In accordance with the well known current steering operation of superconductive loops, termination of the control current through the control line 25 does not affect the new distribution of current between the left and right hand sides of the superconducting loop. As illustrated in FIG. 7c, when the current I supplied to the loop is terminated, a clockwise circulating current of magnitude $I_{circ}$ is established within the loop where $I_{circ}$ is given by $I_{circ} = I/2 - I_{crit}(I_{cont})$. This procedure for establishing the clockwise circulating persistent supercurrent of magnitude $I_{circ}$ is well known in the art of superconductive circuits. This is readily demonstrated by considering applying an upwardly directed current I to the bottom of the loop as illustrated in FIG. 7b, which procedure is tantamount to terminating the current I supplied to the top of the loop. Under these conditions a current of I/2 is directed upwardly in each of the branches of the loop, thus algebraically adding to the currents illustrated providing the result described.

Figure 8:
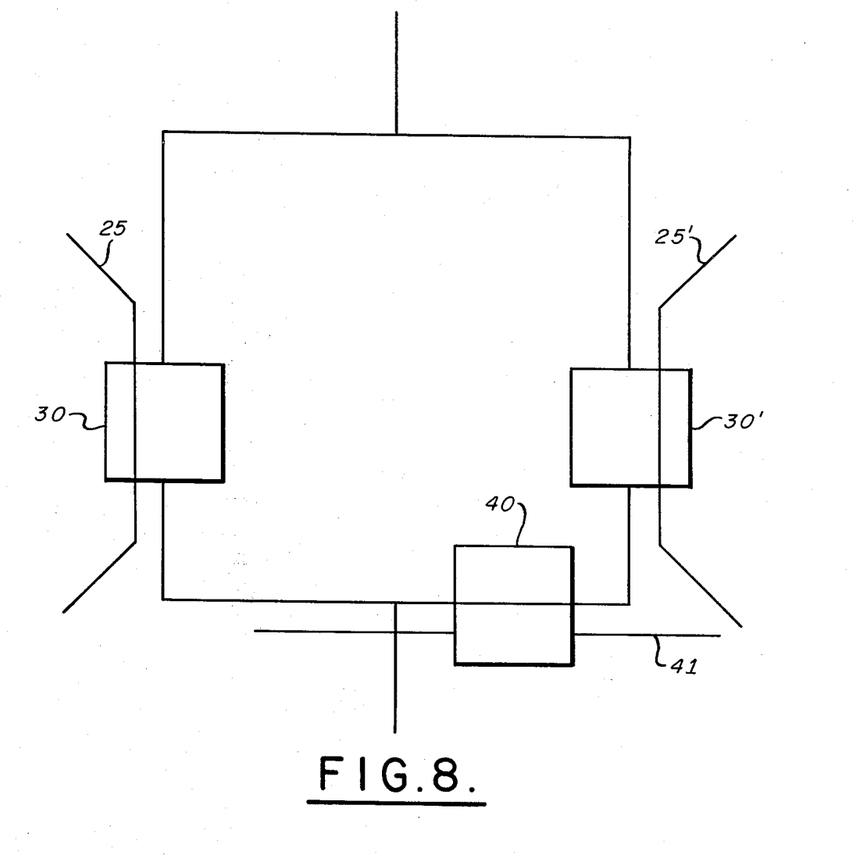
FIG. 8 is a schematic diagram of a memory loop incorporating right hand and left hand SQUID switches as well as a SQUID sensing element.

Referring now to FIG. 8, a memory loop of the type discussed with respect to FIG. 7 is illustrated with a multiple weak-link SQUID device in each of the right and left hand branches of the loop as well as a SQUID sensing device 40 for sensing the state of the data stored in the loop. The SQUIDs 30, 30' and 40 are of the type discussed above with respect to FIGS. 1–3 where the line 41 of the SQUID 40 indicates the path through the weak-links of the SQUID via the extensions 22 and 23. The memory loop itself serves as the control line for the sensing SQUID 40.

It will be appreciated that the analysis discussed above with respect to FIG. 7 with respect to the SQUID 30 in the left hand branch of the loop may be applied to the SQUID 30' in the right hand branch of the loop. A counter clockwise circulating persistent supercurrent is established within the loop with the appropriate energization of the control line 25'. As is known in the art, the clockwise and counter clockwise circulating currents may represent storage of the binary values 1 and 0. Details of such loops utilizing Josephson tunnel junctions as the active switching elements and as the sensing element are well known in the art and will not be included herein for brevity. The sensing SQUID 40 is utilized in any convenient manner described in the art with respect to the Josephson tunnel junction, for sensing the state of the stored data.

It will be appreciated that the memory application of the SQUID of the present invention is exemplary and not limiting. Practitioners skilled in the art will appreciate that the multiple weak-link SQUID of the present invention may be utilized in any superconductive circuit that heretofore employed Josephson tunnel junctions as the active switching element. It is appreciated that the SQUID of the present invention may be utilized in such circuits as triple path memory loops, multiplier circuits, adder circuits, a wide variety of logic circuits, shift register circuits, comparator circuits and the like.

The multiple weak-link SQUID of the present invention has numerous advantages over the prior art as follows:

(1) The weak-link SQUID of the present invention is readily fabricated utilizing only refractory superconductive material. Specifically the only superconductive material required may be sputtered niobium which is readily and reliably deposited and exhibits a high superconductive transition temperature simplifying the requirements of the cryogenic refrigeration equipment. The high melting temperature of refractory metals including niobium renders the circuits fabricated therefrom easier to process and more rugged. Recycling between room temperature and cryogenic temperatures causes less stress with respect to differential expansion coefficients than is experienced with circuits fabricated from "soft" (lead alloy) superconductors.

(2) Since the multiple weak-link SQUID of the present invention may be utilized in place of conventional Josephson tunnel junctions, the spurious resonant "Fisk states" which cause problems with the tunnel junctions if transitions from the zero voltage occurs to these states rather than nearly to the band gap voltage as required are eliminated. The SQUID of the present invention is not subject to these spurious states. Thus the special shapes necessitated in the tunnel junction to eliminate these internal resonances which interfere with the operation of the circuit are not required with the present invention.

(3) The properties of the multiple weak-link SQUID are less sensitive to minor variations in the thickness of the critical insulator layer (layer 12 of FIG. 2) than are the properties of the Josephson tunnel junction with respect to its tunneling barrier. The tunnel junction has a zero-voltage Josephson current which depends strongly upon the thickness of the tunneling insulator barrier, the dependence being at least as strong as exponential. Thus a small variation in barrier thickness produces a large variation in the zero-voltage Josephson current. The zero-voltage Josephson current of a weak-link is, however, not nearly as sensitive to the length of the weak-link determined by the thickness of the insulator layer 12 as is the Josephson tunnel junction with respect to the tunneling insulator barrier. Fractional variations in the thickness of the insulator layer 12 of the SQUID of the present invention will have a significantly smaller effect upon the critical current levels of these devices than will the same fractional variation in the insulator barrier of the tunnel junction. It is furthermore appreciated that because of the extreme thinness of the insulators suitable as Josephson tunneling barriers (10–30 angstrom units), it is more difficult to provide a fabrication method for tunnel junctions which permits only a small fractional variation in the barrier thickness than it is for the significantly thicker weak-link defining insulator layer 12 which may be between several hundred to ten thousand angstrom units thick.

(4) The internal capacitance of the multiple weak-link SQUID is beneficially less than the tunnel junction that it replaces. The capacitance is lower for two reasons. Firstly, as discussed above, the thickness of the insulator layer 12 of the SQUID is significantly greater than that of the tunnel junction insulator barrier. Secondly, the materials generally utilized for tunnel junction insulator barriers have relatively high dielectric constants, the relative dielectric constant of niobium pentoxide ($Nb_2O_5$), for example, being approximately 30. The insulator material for the weak-link SQUID, however, may be silicon dioxide ($SiO_2$), for example, with a dielectric constant of less than 1.5. Since the capacitance of the device is directly proportional to the dielectric constant and the area of the insulator and inversely proportional to its thickness, the active switching device is shunted by a significantly smaller capacitance per unit area for a weak-link SQUID than for a Josephson tunnel junction.

(5) Superconductive Josephson circuits utilizing the weaklink SQUID will occupy significantly smaller area than functionally similar circuits utilizing the Josephson tunnel junction. This is because, as is known, tunnel junction loop memory circuits, for example, which exhibit reliably consistent switching must be critically damped. In the resistively shunted junction model this requires that $$4 R_J^2 c < L$$

where $R_J$ is an effective resistance of the device often taken to be equal to the differential resistance of the quasi-particle current-voltage characteristic at voltages below the bandgap. For a tunnel junction C is primarily internal to the device because of the extremely thin tunneling barriers fabricated with high dielectric constant materials and L is primarily external to the device, produced by lengths of the low characteristic impedance microwave strip transmission lines which comprise the loop. It is this required length of the loop perimeter which results in an undesirably large area in the fabrication of a critically damped loop memory.

A memory loop, for example, utilizing multiple weak-link SQUIDs rather than tunnel junction devices should require a significantly smaller external inductance for two reasons. Firstly the smaller capacitance of the active device will make the above inequality easier to satisfy. Secondly, to the extent that the resistively shunted junction model applies to weak-link SQUIDs, the SQUIDs will have an effectively smaller R since they usually have a significantly higher value of dI/dV for non-zero voltages than does a non-leaky tunnel junction. The smaller cell area achievable with the SQUID permits denser packing and larger size memory arrays when the SQUID rather than the tunnel junction is utilized as the active switching device. The denser packing also reduces read and write cycle times for arrays containing the same number of bits when utilizing SQUIDs rather than tunnel junctions since propagation delays will be accordingly smaller.

(6) Less power will be consumed by circuits utilizing weak-link SQUIDs than analogous circuits utilizing tunnel junctions. This is because fast operation of the tunnel junction circuits requires that the instantaneous voltage approach the superconducting bandgap voltage which is typically greater than 2 millivolts during the switching transient. The maximum voltage excursion of the weak-link SQUID is only required to be on the order to 0.2 millivolts for a large current transfer to a parallel superconducting path. Additionally, it is believed that the maximum current required for fast operation of the SQUID device is less than that required for tunnel junctions.

From the above it is appreciated that an improved speedpower product for weak-link SQUID circuits is expected. Denser volume packing of SQUID circuits is therefore possible without exceeding limits imposed by excessive heat generation mechanisms which could reduce the utility or increase the cost of cryogenic computers.

(7) The design of the SQUID of the present invention results in efficient utilization of expensive electron-beam lithography in the fabrication process for the device. The SQUID of the present invention provides the significant benefits discussed herein and only requiring electron beam lithography to produce a small number of micron or submicron holes. As few as two short beam exposures per active device are all that are required. Thus, the time required to cycle a device, or produce an X-ray mask by electron-beam lithography is exceedingly short compared to the time necessary to produce the complete masking requirements for an entire large perimeter circuit as would, for example, be required to produce a large area small dimensioned bubble memory mask. Except for the weak-link definitions, the remainder of the circuit can be fabricated utilizing standard and inexpensive photo lithography. It will be appreciated that all of the weak-link definitions can be performed simultaneously in one step.

(8) As discussed above, the thickness of the insulator layer 12 and the separation between the weak-links 13 and 14 both affect the sensitivity of the regulation of the critical current through the device by the current through the control line. Thus, the SQUID of the present invention has two independent variables available to regulate the sensitivity. Increasing both the thickness of the insulator 12 and the separation between the weak-links 13 and 14 will increase the sensitivity although the insulator layer must be substantially as thick as the depth of magnetic field penetration into the superconductive layers before the insulator layer thickness is a sensitive control. It is appreciated that the thickness of the insulator layer can readily be substantially greater than the magnetic field penetration depth thus providing a fine regulation of the critical current sensitivity to magnetic fields. This sensitivity control can be especially effected by utilizing non-uniform or double layer SQUID insulators.

(9) Generally, the ratio of required control line current to controlled critical current is less than a multiple weak-link SQUID of the present invention than for a Josephson tunnel junction. This results in greater logic current gain with greater possible fan-out and generally more flexibility in logic circuit design.

It will be appreciated from the foregoing that because of the quantum interference effect exhibited by parallel superconductive paths (the weak-links 13 and 14), an active switch extremely sensitive to magnetic control fields is provided. The direction of current flow in the control line preferably should be substantially parallel to the direction defined by a straight line connecting the weak-links for maximum control of the zero-voltage current of the device by the magnetic field produced by the current flowing through the control line.

From the foregoing it is appreciated that the sensitivity of the control of the zero voltage current flowing between the upper and lower superconductors of the device by the magnetic field generated by the control line current may be varied by adjusting the spacing between the weak-links and by controlling the thickness of the weak-link defining insulator layer. It will be further appreciated that the insulator layer separating the upper and lower superconductive layers may be advantageously of non-uniform thickness. This non-uniformity may be achieved by a double layer deposition or a double photoresistive masking procedure. The non-uniform thickness may be utilized in the following manner. An optimum insulator thickness may exist for the production of weak-links of a preferred diameter. For example, it may be more difficult to produce a weak-link of a diameter significantly smaller than the height of the insulator than to produce one of comparable or larger diameter. Conflicting therewith may be a different optimum thickness or a material with a different dielectric constant than that used to define the weak-links for controlling the capacitance of the device. A non-uniformly thick layer or double insulator layers would enable optimization of both requirements whereas a single uniformly thick layer would require a compromise.

It will be appreciated that multiple control lines to provide multiple input logic circuits may be utilized as well as single or multiple control lines together with bias control lines. A bias control line performs the same physical function as the control line described above but carries only a time invariant current thus biassing the control range of the device. The bias control line functions to cause a permanent change in the range of currents present in the normal control lines which causes a given variation in the critical current through the device.

It will furthermore be appreciated that although the above described embodiment of the invention was explained in terms of utilizing refractory superconductive materials for the advantages that they provide, the invention may also be practiced utilizing any other suitable superconductive materials. The SQUID device described above, although preferably utilized as an active switch replacement for Josephson tunnel junctions, may also be utilized for other purposes such as for use as a magnetometer.

For the foregoing reasons, the multiple weak-link SQUID of the present invention can be utilized as the active switching element in Josephson superconductive circuits instead of the conventional Josephson tunnel junction but with significantly greater ease of fabricating the integrated circuits and with improved performance as discussed above.

While the invention has been described in its preferred embodiments, it is to be understood that the words which have been used are words of description rather than limitations and that changes may be made within the purview of the appended claims without departing from the true scope and spirit of the invention in its broader aspects.

I claim:
1. A SQUID comprising
first and second layers of superconductive material superposed with respect to each other, and
insulator layer means disposed between said superconductive layers, said insulator layer means having at least two holes therethrough with superconductive material therein forming weak superconducting links between said first and second superconductive layers,
whereby a magnetic field applied to said SQUID causes control of the supercurrent flowing between said first and second superconductive layers,
said SQUID further including control line means proximate said superconductive layers and electrically insulated therefrom for providing a control magnetic field to the area between said weak-links thereby controlling said supercurrent.
2. The SQUID of claim 1 further including superconductive ground plane means with said first and second superconductive layers superposed between said control line means and said ground plane means.
3. The SQUID of claim 1 in which
said insulator layer means has two holes therethrough forming two weak-links, and
said control line means comprises a control line disposed substantially parallel to a straight line defined by said two weak-links.
4. The SQUID of claim 1 in which said first and second layers of superconductive material comprise layers of refractory superconductive material.
5. The SQUID of claim 3 in which said insulator layer means is of such thickness and said two weak-links have such spacing therebetween that a predetermined sensitivity of said supercurrent to said control magnetic field is established.
6. A SQUID for use as a switch in superconductive circuits comprising
superconductive ground plane means,
a first layer of superconductive material superposed with respect to said ground plane means,
a second layer of superconductive material superposed with respect to said first layer of superconductive material,
insulator layer means disposed between said first and second superconductive layers, said insulator layer means having at least two holes therethrough with superconductive material therein forming weak superconductive links between said first and second superconductive layers, and
control line means superposed with respect to said second superconductive layer and electrically insulated therefrom for providing a control magnetic field to the area between said weak-links thereby controlling the supercurrent flowing between said first and second superconductive layers.
7. The SQUID of claim 1 in which
said holes are of such width as to only support weak-link superconductivity, and
said weak-links are substantially parallel to each other and of such spacing therebetween to cause quantum interference therebetween when supercurrent flows therethrough.
8. A SQUID for use as a switch in superconductive circuits comprising
a superconductive ground plane,
a dielectric layer deposited on said ground plane,
a first layer of superconductive material deposited on said dielectric layer,
a first insulator layer deposited on said first superconductive layer with at least two holes therethrough,
a second layer of superconductive material deposited on said first insulator layer whereby superconductive material is deposited in said holes forming weak superconductive links between said first and second superconductive layers, a second insulator layer deposited on said second superconductive layer, and control line means deposited on said second insulator layer for providing a control magnetic field to the area between said weak-links thereby controlling the supercurrent flowing between said first and second superconductive layers.

9. The SQUID of claim 8 in which said holes through said first insulator layer are formed by electron beam lithography.

10. A method of manufacturing the SQUID of claim 9 comprising the steps of depositing a dielectric layer on a superconductive ground plane, depositing a first layer of superconductive material on said dielectric layer, depositing a first insulator layer on said first superconductive layer, forming at least two holes through said first insulator layer, depositing a second layer of superconductive material on said first insulator layer forming weak superconductive links through said holes with said first superconductive layer, depositing a second insulator layer on said second superconductive layer, and depositing superconductive control line means on said second insulator layer.

11. The method of claim 10 in which said forming step comprises forming said holes by electron beam lithography.

* * * * *